United States Patent [19]
Simmons et al.

[11] Patent Number: 5,233,617
[45] Date of Patent: Aug. 3, 1993

[54] ASYNCHRONOUS LATCH CIRCUIT AND REGISTER

[75] Inventors: Laura E. Simmons, Tempe; Joseph A. Thomsen, Chandler; Marty L. Long, Mesa, all of Ariz.

[73] Assignee: VLSI Technology, Inc., San Jose, Calif.

[21] Appl. No.: 509,656

[22] Filed: Apr. 13, 1990

[51] Int. Cl.⁵ .............................................. H03K 5/135
[52] U.S. Cl. ....................................... 371/61; 307/443; 307/269
[58] Field of Search ............ 307/443, 480, 269, 272.1, 307/272.3; 371/61, 57.1

[56] References Cited

U.S. PATENT DOCUMENTS

| | | | |
|---|---|---|---|
| 3,555,255 | 1/1971 | Toy | 371/49.2 |
| 3,950,705 | 4/1976 | Fuerherm | 307/443 X |
| 4,999,528 | 3/1991 | Keech | 307/443 X |

FOREIGN PATENT DOCUMENTS 127850  7/1985  Japan .................................. 371/6

OTHER PUBLICATIONS

Millman, J. et al., *Microelectronics*, McGraw-Hill Book Co., 1987, pp. 315, 316, 323, 324.

*Primary Examiner*—Stephen M. Baker
*Attorney, Agent, or Firm*—Hickman & Beyer

[57] ABSTRACT

An asynchronous latch circuit characterized by a pair of D-type flip-flops and a D-type latch. Data is clocked into a first flip-flop by a system clock signal and the output of the first flip-flop is clocked into a second flip-flop by an asynchronous latch enable signal. A comparator compares the outputs of the first and second flip-flops and develops an error signal if the two are not the same. The error signal forces the output of the latch to a known condition rather than letting the output be indeterminate. In an asynchronous latch register an error signal from any one of the asynchronous latch circuits will force all of the latch circuits in the register to a known condition to eliminate race condition errors.

7 Claims, 3 Drawing Sheets

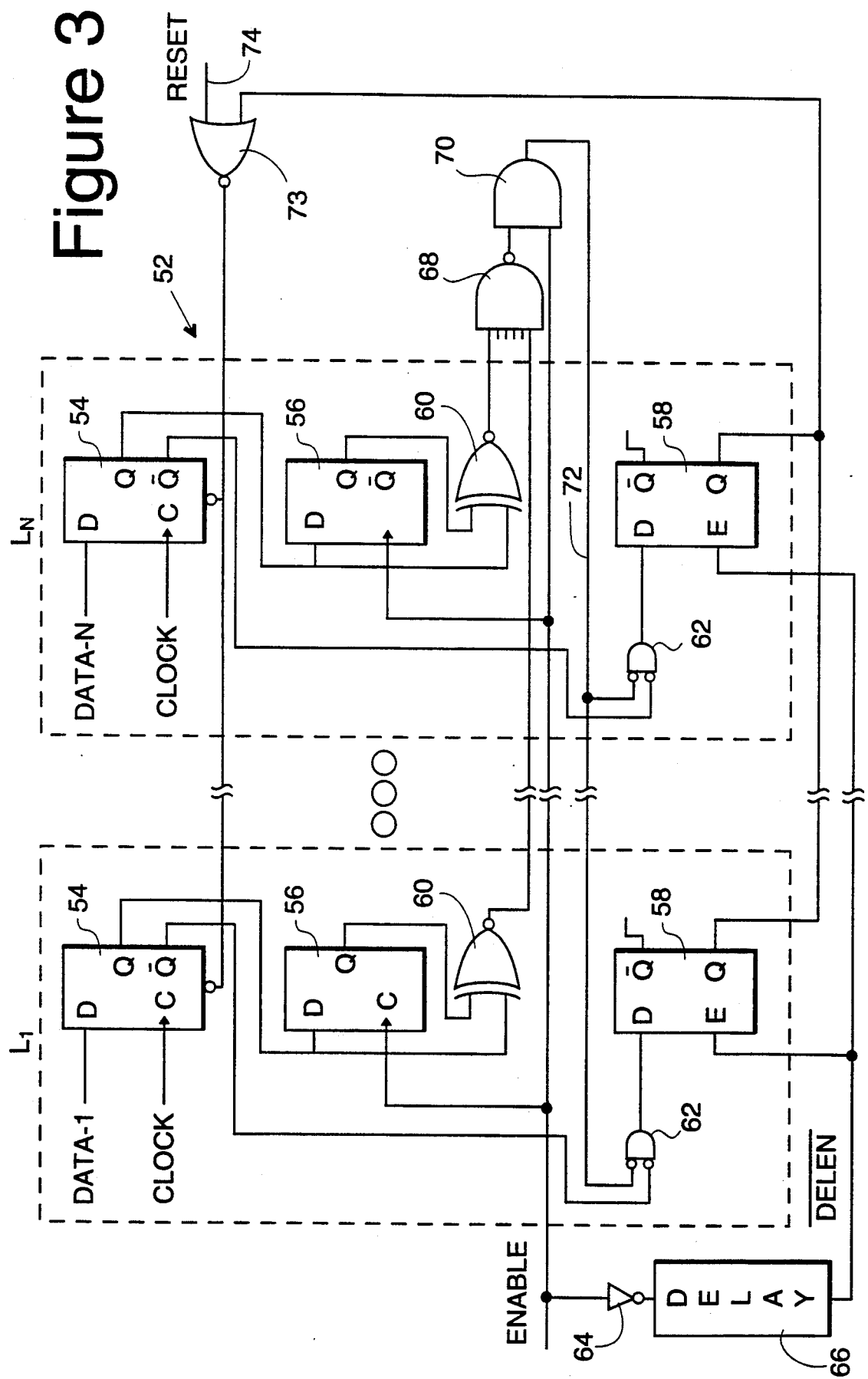

ASYNCHRONOUS LATCH CIRCUIT AND REGISTER

BACKGROUND OF THE INVENTION

This invention relates generally to digital electronic circuits and more particularly to error detection and correction in asynchronous digital electronic circuits.

The majority of operations within a digital electronic circuit are synchronous: i.e. the various gates, flip-flops, registers etc. within the circuit are synchronized by clock pulses generated by a mater clock. This synchronization minimizes problems caused by the inherent delay of signals as they flow through the circuit by ensuring that the appropriate input signals are present before a circuit element is activated.

Asynchronous operation occurs when various elements within a circuit are not synchronized to the same clock. As noted in *Microcomputer Interfacing*, Harold S. Stone Addison-Wesley Publishing Company, 1983., pp. 108, the only way to be sure that a system is free from clocking difficulties is to use a single master clock from which all other timing is derived. Therefore, asynchronous operation is inherently subject to clocking errors which must be detected and hopefully remedied to ensure the proper operation of the asynchronous circuitry.

The problem of asynchronous operation can be exemplified by the prior art asynchronous latching circuit illustrated in FIG. 1a. The circuit includes a leading edge triggered, D-type flip-flop 10 having a D input, a Q output and a C input coupled to a clock signal. The Q output of the flip-flop 10 is coupled to a D input of a latch 12. The latch 12 has an E input coupled to an enable signal and a Q output which is latched to the value of the D input when the enable signal goes high. The clock signal and the enable signal are completely asynchronous, i.e. there is no relationship between the frequency, timing or duration of the two signals. Due to this lack of synchronization a "race condition" error can occur at the Q output of the latch 12.

The race, in this particular example, is along the data line 14 coupling the Q output of flip-flop 10 to the D input of latch 12. In FIG. 1b the clock and enable signals are shown along with the OUT1 signal and the Q output of flip-flop 10 and the OUT2 signal at the Q output of the latch 12. As seen in this figure, there is no relationship between the regular pulses of the clock and the asynchronous enable signal. The OUT1 signal is briefly indeterminate at points 16 when the flip-flop 10 is triggered by the leading edge of a clock pulse. Likewise, the OUT2 signal is indeterminate at points 18 whenever the latch 12 is enabled by the leading edge of the enable signal or by the leading edge of the clock signal when the enable signal is already high.

A race problem occurs when the latch 12 is attempting to latch the value at its D input to its Q output at the same time that the OUT1 signal is indeterminate. This is illustrated at a time $t_1$ in FIG. 1b where the leading edge of the clock has produced an indeterminate OUT1 signal at the same time that the trailing edge of the enable signal is trying to latch the latch 12. If the OUT1 signal out-races the latching delay of latch 12 the proper data is latched at the Q output of the latch 12. On the other hand, if the OUT1 signal loses the race potential garbage G may be latched at the Q output of latch 12. As used herein, "garbage" means that the output state of the latch is completely unknown in that it could be a logic 0, a logic 1, a metastable state in between the two, or some oscillatory or transitory state. Once created, the garbage G may persist until the latch 12 is enabled at a time $t_2$ with the leading edge of an enable pulse.

While a race problem in a particular asynchronous latch circuit may be fairly rare it is still problematic in digital system where data integrity is taken for granted. Moreover, when a digital system includes a number of asynchronous latch circuits combined into a multi-bit register the cumulative race problems may be substantial leading to significant data errors. Since each latch circuit in a register has its own, slightly different propagation rate, old data, new data and/or garbage may be present at the various output bits of the register during race conditions. For example, the data in one latch circuit may win the race resulting in new data in a register bit, while the data in another, slightly slower latch circuit may lose the race resulting in old data or garbage in another register bit. Since registers typically include information used to direct the action of logic circuitry, these race condition generated errors should be avoided if at all possible.

In a specific example, a common asynchronous circuit is the Universal Asynchronous Receiver Transmitter (UART) which includes several registers each of which may include a number of asynchronous latch circuits. Typically, one of these UART registers includes an error register comprised of a number of asynchronous latch circuits which indicate certain transmission/reception errors by an appropriate pattern of bits and the luck transmission/reception errors by all low bits. If the error register is subject to race conditions old data, new data and/or garbage may be present in the various bits of the register which could result in inappropriate actions being taken by the system receiving data from or sending data to the UART. Since the race condition problem cannot be eliminated from asynchronous circuits, it is therefore imperative to detect such problems and to take appropriate corrective actions.

SUMMARY OF THE INVENTION

An asynchronous latch circuit in accordance with the present invention resolves the race problem found in the prior art by clocking data into a first D-type flip-flop with the system clock signal and then by clocking the output of the first D-type flip-flop into a second flip-flop using the enable signal. The outputs of the first and second flip-flops are then compared to see if a race condition had occurred on the data line coupling the two flip-flops thereby possibly causing the outputs of the two flip-flops to be different. If the outputs of the first and second flip-flops are different a race condition error is detected and an error signal is produced. The error signal forces the data input of the latch low and a delayed, inverted version of the enabling signal latches the Q output of the latch to a low value. In consequence, when an error is detected due to a race condition the output of the latch is forced to a known condition to prevent unpredictable signals at the output of the asynchronous latch circuit.

The disclosed latch circuit is particularly well adapted for use in registers where the outputs of the register are relatively stable. For example, the error register of a UART typically stores all low bits indicating that there was no transmission or reception error. In other words, for a UART error register the data input into the first flip-flop is almost always low indicating no error condition in the reception or transmission of that bit of data.

In those rare times when a race condition error occurs it is far more likely that the input data was low and, therefore, it follows that the latch should be forced low as a default. Therefore, in such applications, the asynchronous latch circuit of the present invention not only detects a race condition error but also tends to correct the error.

As mentioned previously, race condition situations tend to be more severe in registers than in individual asynchronous latch circuits. For this reason, an asynchronous latch register in accordance with the present invention combines the error signals of all of its constituent asynchronous latch circuits and forces the Q outputs of al the data latches low, i.e. to the known state. In other words, if a race condition is detected in any one asynchronous latch circuit the outputs of all of the latch circuits of the register are forced to a known condition because all of the output data is suspect under race conditions.

These and other advantages of the present invention will become clear to those skilled in the art upon a study of the detailed description of the invention and of the several figures of the drawings.

BRIEF DESCRIPTION OF THE DRAWINGS

FIG. 1b is a timing diagram illustrating the operation of the prior art asynchronous latch circuit of FIG. 1a.

FIG. 2b is a timing diagram illustrating the operation of the asynchronous latch circuit of FIG. 2a.

FIG. 3 is an asynchronous latch register in accordance with the present invention.

DETAILED DESCRIPTION OF THE PREFERRED EMBODIMENTS

Figure 1A:
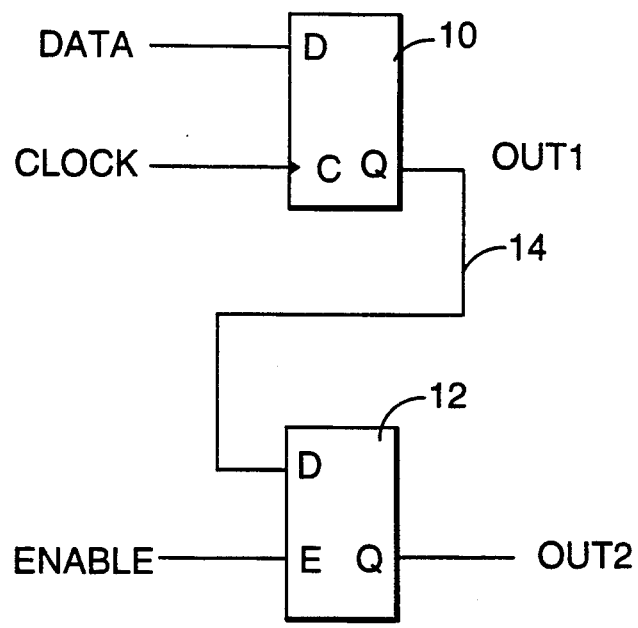
FIG. 1a is a block diagram of a prior art asynchronous latch circuit.
Figure 1B:
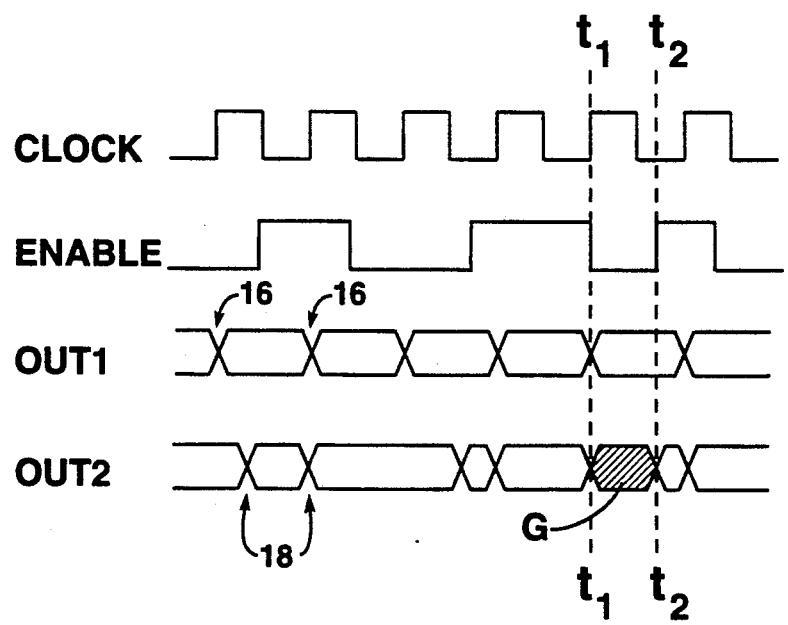
Figure 2A:
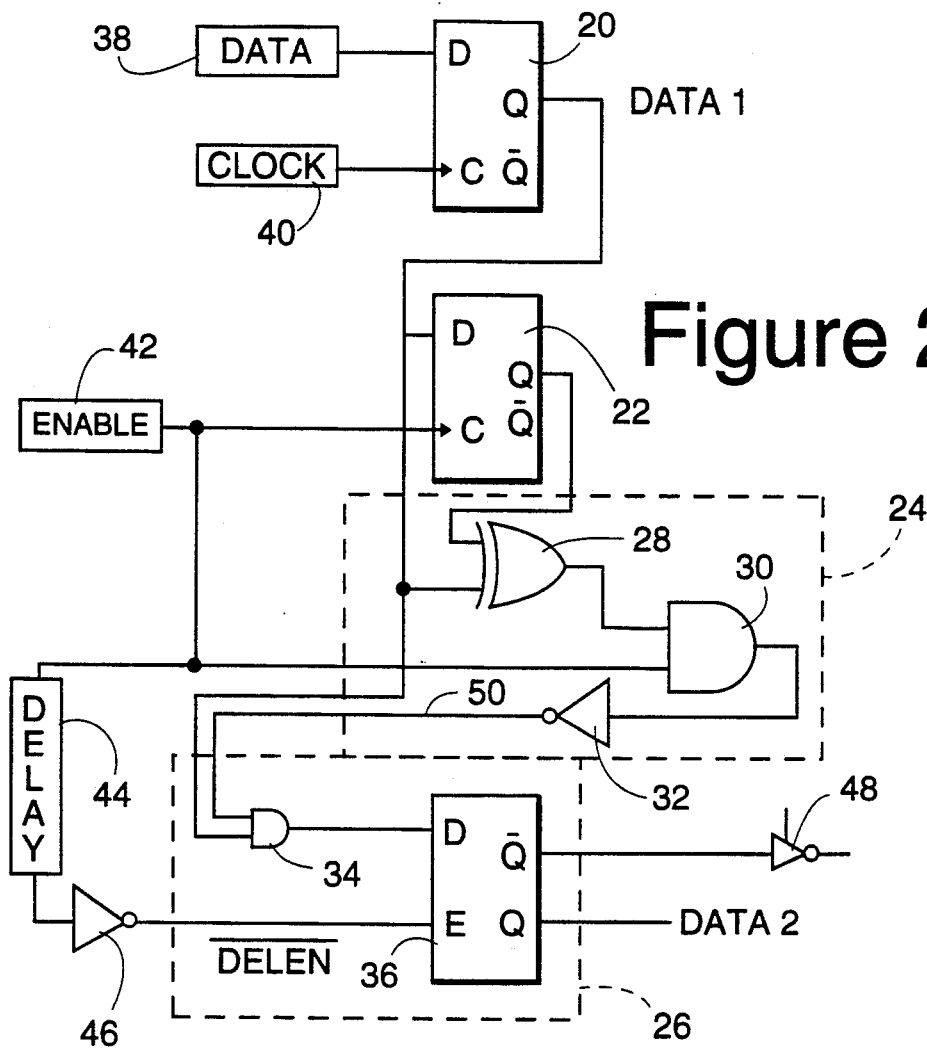
FIG. 2a is an asynchronous latch circuit in accordance with the present invention.

FIGS. 1a and 1b illustrate the circuit and operation, receptively, of a prior art asynchronous latch circuit which may be subject to race condition errors. In FIG. 2a, an improved asynchronous latch circuit in accordance with the present invention includes a first D-type flip-flop 20, a second D-type flip-flop 22, a comparator circuit 24 and a latch circuit 26. The comparator circuit 24 includes an XOR (exclusive or) gate 28, an AND gate 30 and an inverter 32. The latch circuit 26 includes an AND gate 34 and a D-type latch 36.

Data from a data source 38 is coupled into the D (data) input of the first flip-flop 20 while a clock 40 provides a CLOCK signal at the C (clock) input of the first flip-flop 20. The Q output of first flip-flop 20 is coupled to the D input of the second flip-flop 22 and an ENABLE signal 42 is coupled to the C input of the second flip-flop 22. The Q outputs of the flip-flops 20 and 22 are coupled to the inputs of the XOR gate 28 which produces an output which is coupled to an input of AND gate 30. The other input AND gate 30 is coupled to the ENABLE signal 42. The output of AND gate 30 is coupled to an input of AND gate 34 by inverter 32 while the other input of AND gate 34 is coupled to the Q output of first flip-flop 20. The E (enable) input of latch 36 is coupled to the ENABLE signal 42 by a delay 44 and an invertor 46. A tri-state invertor 48 is coupled to the not-Q output of latch 36 to provide a buffered output for the latch.

Figure 2B:
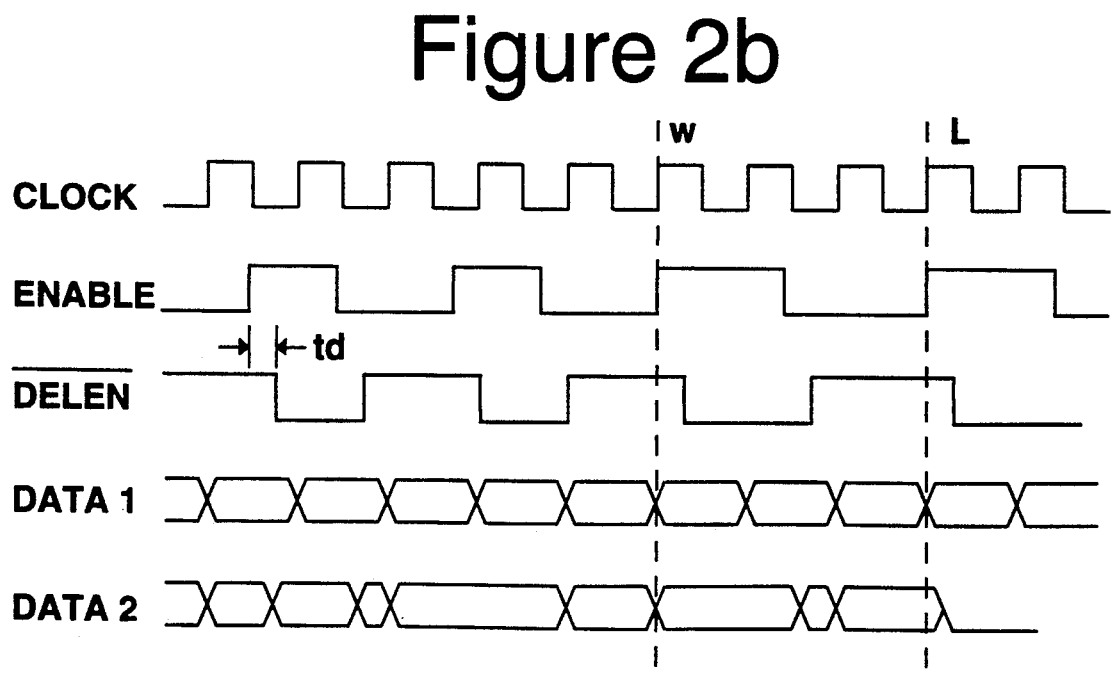

In the timing diagram of FIG. 2b it can be seen that the clock 40 produces a regular CLOCK signal while the ENABLE signal 42 is unpredictable in pulse width and timing and is therefore completely asynchronous with the CLOCK signal. The not-DELEN signal at the input is the inverse of the ENABLE signal and is delayed by a time $t_d$ by the delay 44. DATA1 is the data present at the Q output of the first flip-flop 20 and DATA2 is the data present at the Q output of the latch 36.

In operation, a datum is clocked into first flip-flop 20 by the leading edge of the CLOCK signal from clock 40. This datum, when it appears at the Q output of the first flip-flop 20, is referred to as DATA1. DATA1 is then clocked into second flip-flop 22 by the leading edge of the ENABLE signal 42. The Q outputs of the flip-flops 20 and 22 are then compared to XOR gate 28. If both of the Q outputs are the same, then DATA1 does not violate the race condition, and the correct datum is present at the Q output of the flip-flop. This winning condition is illustrated at point W in the timing chart of FIG. 2b. If, on the other hand, the Q outputs of the two flip-flops are different then DATA1 lost the race to the second flip-flop 22 and an error condition exits. This losing condition is illustrated at point L in FIG. 2b. It should be noted that the occurence at point L is the rarity, i.e. the race is only lost when both the CLOCK signal and the ENABLE signal are rising substantially simultaneously and when the DATA1 signal is still indeterminate as the second flip-flop 22 completes its clocking cycle.

If the signals at the inputs of XOR gate 28 are the same, i.e. both low or both high, then the output of XOR gate will be low. This ensures that the output of AND gate 30 will be low and that the input from the invertor 32 to the AND gate 34 will be high thereby essentially converting the operation of the AND gate to that of a buffer. In consequence, when the data within flip-flops 20 and 22 are the same, the D input signal of the latch 36 receives DATA1 via AND gate 34.

If, on the other hand, the signals at the inputs of XOR gate 28 are not the same, it is clear DATA1 violates the race condition and that an error has occurred. Since the inputs to the XOR gate 28 are different, the output of the XOR gate is high, essentially converting the operation of AND gate 30 to that of a buffer. The ENABLE signal 42 passes through the AND gate 30 and is inverted by invertor 32. Therefore, an ERROR signal present on a line 50 is equivalent to a not-ENABLE signal, and which is therefore low because the ENABLE signal had just gone high to trigger the second flip-flop 22. In consequence, the output of the AND gate 34 is low regardless of the level of DATA1 during this error condition.

As mentioned previously, the not-DELEN signal is delayed by a period $t_d$. This period $t_d$ must be sufficiently long to allow signal propagation though the second flip-flop 22, the comparator circuit 24 and the AND gate 34. Because of this delay, not-DELEN signal will be high for the period $t_d$ after the ENABLE signal goes high, allowing the Q output of the latch 36 to be the same as the D input of the latch 36. After the period $t_d$ the not-DELEN signal will go low, latching the value of the D input to the Q output.

If no race error had been detected by the comparator circuit 24 the DATA2 signal at the output of latch 36 will therefore be the same as the DATA1 signal and the asynchronous latch circuit will have acted properly. If a race error has been detected, the D input of the latch 36 will have been forced low and the DATA2 signal will be forced low. This is illustrated in FIG 2b at time point L where there was a race condition error and DATA2 is forced low, i.e. to a known condition. As explained previously, this form of error correction works well when the latch circuit is in the known condition the vast majority of the time, such as in error registers where an error condition is the exception rather than the rule.

In FIG. 3, an asynchronous latch register 52 in accordance with the present invention includes a number of asynchronous latch circuits $L_1 \ldots L_N$. Each of the latch circuits is substantially identical in construction and operation, so like numerals will refer to like components in all of the asynchronous latch circuits. Each of the latch circuits $L_1, \ldots, L_N$ includes a first D-type flip-flop 54, a second D-type flip-flop 56, a D-type latch 58, a NXOR (inverted output XOR) gate 60, and an inverted input AND gate 62. The respective data for each latch circuit is coupled to the D input of the first flip-flops 54, while the system clock is coupled to the C inputs of the first flip-flops 54. The Q outputs of the first flip-flops 54 are coupled to the respective D inputs of the second flip-flops 56, while the C inputs of the second flip-flops 56 receive the ENABLE signal. The inputs of the NXOR gates 60 are coupled to the Q outputs of their respective flip-flops 54 and 56 to perform the comparison function. The D inputs of the latches 58 receive the not-Q outputs of their respective first flip-flops 54 through their respective inverted input AND gates 62. The enable input of the latches 58 receive the enable signal via an invertor 64 and a delay 66. The output terminals of the XNOR gates 60 are coupled to the N inputs of a single NAND gate 68. The output terminal of the NAND gate 68 is coupled to one input terminal of a two-point AND gate 70, and the other input terminal of the AND gate 70 receives the ENABLE signal. The output terminal of AND gate 70 is coupled to one of two input terminals of each of the inverted input AND gate 62. The other input terminal of the inverted input AND gate 62 receives the Q output signal from the respective flip-flop 54.

The operation of each of the asynchronous latch circuits $L_1 \ldots L_N$ is substantially the same as the operation of the individual asynchronous latch circuit described with reference to FIG. 2a with the following differences. When the data within flip-flops 54 and 56 are the same, the output of the NXOR gates 60 will always be high. This will force the output of NAND gate 68 and AND gate 70 low, converting the operation of the inverting input AND gates 62 to essentially that of an invertor. In consequence, when the data in the two flip-flops 54 and 56 of each of the latch circuits are the same (indicating no race condition error) the D inputs of the latches 58 will be the same as the Q output of the first flip-flops 54. On the other hand, when a race condition error occurs within one of the latch circuits the data within flip-flops 54 and 56 of that latch circuit will not be the same and the output of associated NXOR gate will be low. Therefore, a race condition error detected in any one of the asynchronous latch circuits $L_1 \ldots L_N$ will force the output of NAND gate 68 high and the ENABLE signal at the output of the AND gate 70 will appear as an ERROR signal on line 72. Since the ENABLE signal had just gone high to trigger the second flip-flops 56, the outputs of the inverted input AND gates 62 are forced low. In consequence, when the not-DELEN signal from the time delay module 66 triggers the latches 58, all of the Q outputs of these latches will initially be forced low, i.e. to a known state, when any one of the asynchronous latch circuit detects a race condition error. This is the desired result because the detection of a race condition in any one latch circuit signals that the output of the register as a whole may be unreliable for the aforementioned reasons, i.e. different propagation rates of the data through the latch circuits may potentially cause old and new data and/or garbage to be read from the various latch circuits of the register.

The asynchronous latch register 52 also includes a NOR gate 73 having inputs coupled to the Q outputs of latches 58 and to a master reset line 74. As in the case with the individual asynchronous latch circuit described previously, the data from he latch register 52 is preferably taken from the not-Q outputs of the latches 58 via tri-state buffers (not shown). The NOR gate 73 automatically resets the first flip-flops 54 of all of the asynchronous latch circuits $L_1 \ldots L_N$ after a true error condition is observed at the output of the register or when a master RESET signal is present on reset line 74.

While this invention has been described in terms of several preferred embodiments, it is contemplated that various alterations and permutations thereof will become apparent to those skilled in the art. It is therefore intended that the appended claims include all such alterations and permutations as fall within the true spirit and scope of the present invention.

What is claimed is:

1. An asynchronous latch circuit comprising:
   a first D-type flip-flop having a first clock input terminal coupled to a clocking signal, a first data input terminal and a first data output terminal;
   a second D-type flip-flop having a second input terminal that receives an enabling signal, a second data input terminal and a second data output terminal;
   comparator means having three comparator input terminals that receive said first data output signal, said second data output signal and said enabling signal, operative to generate and issue an output error signal on a comparator output terminal when said first data output signal and said second data output signal are unequal and operative to generate and issue a selected output signal at said comparator output terminal when said first data output and said second data output are equal;
   inverting time delay means having an input to receive said enabling signal and to issue a time delayed, inverted enabling output signal; and
   a D-type latch having an enabling input terminal to receive said time delayed, inverted enabling output signal, a latch data input terminal to receive said comparator output signal from said comparator means, a latch output terminal and means responsive to receipt of said error signal for setting said third data output to a known state when said signals on said first data output terminal and said second data output terminal are unequal.

2. An asynchronous latch circuit as recited in claim 1, wherein said comparator means includes an XOR means for forming the EXCLUSIVE OR function of at least two input signals, said XOR means having input terminals coupled to said first data output terminal and to said second data output terminal and having an XOR output terminal, and includes AND means having input terminals that receive said XOR output signal and said enabling signal and having an AND output terminal coupled to said comparator output terminal.

3. An asynchronous latch register comprising:
(a) a plurality of asynchronous latches, each including:
   first bit storage means clocked by a clocking signal, having a first input terminal coupled to a data line, and having a first output terminal;
   second bit storage means clocked by an enabling signal having a second input terminal coupled to said first output terminal, and having a second output terminal;
   comparator means having two comparator input terminals coupled to said first output terminal and said second output terminal and operative to generate and issue an error output signal at a comparator output terminal when said first output signal and said second output signal are unequal; and
   latch means having an enabling input terminal that receives said enabling signal, having a latch data input terminal coupled to said first output terminal, and having a latch output terminal;
(b) error detection means coupled to said comparator output terminals of said plurality of asynchronous latches and operative to force said latch means of said plurality of asynchronous latches to a known state when said error signal is detected; and
(c) reset means coupled to said latch output terminal and operative to clear said first bit storage means in each of said plurality of asynchronous latches when said latch output signals are not all in said known state.

4. An asynchronous latch register comprising:
(a) a plurality of asynchronous latches, each including:
   first bit storage means clocked by a closing signal, having a first input terminal coupled to a data line, and having a first output terminal;
   second bit storage means clocked by an enabling signal, having a second input terminal coupled to said first output terminal, and having a second output terminal;
   comparator means having two input terminals coupled to said first output terminal and said second output terminal and operative to generate and issue an error signal at a comparator output terminal when said first output signal and said second output signal are unequal; and
   latch means having an enabling input terminal that receives said enabling signal, having a latch data input terminal coupled to said first output terminal, and having a latch output terminal;
(b) error detection means coupled to said comparator output terminals of said plurality of asynchronous latches and operative to force said latch means of said plurality of asynchronous latches to a known state when said error signal is detected; and
(c) reset means coupled to said latch output terminal and operative to clear said first bit storage means in each of said plurality of asynchronous latches if said error signal is issued by at least one of said comparator means.

5. An asynchronous latch circuit as recited in claim 4, wherein said reset means also clears said first bit storage means in each of said asynchronous latches in response to receipt of an operator-initiated clear signal.

6. An asynchronous latch circuit comprising:
first signal storage means having a first clock input terminal to receive a clocking signal, said first storage means having a first data input terminal and a first data output terminal;
second signal storage means having a second clock input terminal to receive an enabling signal, said second storage means having a second data input terminal coupled to said first data output terminal and having a second data output terminal;
comparator means having two input terminals coupled to said first data output terminal and to said second data output terminal and operative to generate and issue an error signal at a comparator output terminal when signals on said first data output terminal and said second data output terminal are unequal;
latch means having an enabling input terminal to receive said enabling signal, said latch means having a latch data input terminal coupled to said first data output terminal, a latch data output terminal and means responsive to said error signal for setting a signal issued by said latch data output terminal to a known state when said signals at said first data output terminal and said second data output terminal are unequal; and
reset means coupled to said latch data output terminal for clearing said first signal storage means and said second storage means fi said error signal is issued by said comparator means.

7. An asynchronous latch circuit as recited in claim 6, wherein said reset means also clears said first storage means and said second storage means in response to receipt of an operator-initiated clear signal.

* * * * *